(12) United States Patent
Chien (10) Patent No.: US 9,313,594 B2
(45) Date of Patent: Apr. 12, 2016

(54) IMPEDANCE DETECTING DEVICE AND METHOD

(71) Applicant: REAL TEK SEMICONDUCTOR CORPORATION, Hsinchu (TW)

(72) Inventor: Chih-Kang Chien, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 67 days.

(21) Appl. No.: 14/475,816

(22) Filed: Sep. 3, 2014

(65) Prior Publication Data

US 2015/0124979 A1 May 7, 2015

(30) Foreign Application Priority Data

Nov. 1, 2013 (TW) .............................. 102139880 A (51) Int. Cl.
*H04R 29/00* (2006.01)
*H04R 3/00* (2006.01)
*G01R 27/02* (2006.01)
*H04R 3/12* (2006.01)

(52) U.S. Cl.
CPC .................. *H04R 29/00* (2013.01); *H04R 3/00* (2013.01); *H04R 29/001* (2013.01); *G01R 27/02* (2013.01); *H04R 3/12* (2013.01)

(58) Field of Classification Search
None
See application file for complete search history.

(56) References Cited

U.S. PATENT DOCUMENTS

| | | | |
|---|---|---|---|
| 9,100,757 B2* | 8/2015 | Johnson | H04R 29/001 |
| 2010/0194413 A1* | 8/2010 | Dalbjorn | H03F 1/52 324/713 |
| 2013/0158921 A1* | 6/2013 | Shah | H03F 1/523 702/65 |

* cited by examiner

*Primary Examiner* — Andrew L Sniezek
(74) *Attorney, Agent, or Firm* — WPAT, P.C., Intellectual Property Attorneys; Anthony King (57) ABSTRACT

The present invention discloses an impedance detecting device capable of detecting the impedance value of a load, comprising: an AC signal generating circuit for generating an AC signal; an output buffer for generating an output voltage and an output current according to the AC signal and the impedance value of the load; a current mirror for generating a mirror current according to the output current; a detection impedance for generating a detection voltage according to the mirror current; a comparing circuit for generating a comparison result by comparing the output voltage with the detection voltage; and a control circuit for adjusting at least one of a current ratio of the mirror current to the output current and the impedance value of the detection impedance according to the comparison result until the comparison result has satisfied a predetermined requirement.

22 Claims, 5 Drawing Sheets

PRIOR ART

IMPEDANCE DETECTING DEVICE AND METHOD

BACKGROUND OF THE INVENTION

1. Field of the Invention

The present invention relates to a detecting device and method, especially to an impedance detecting device and method.

2. Description of Related Art

Figure 1:
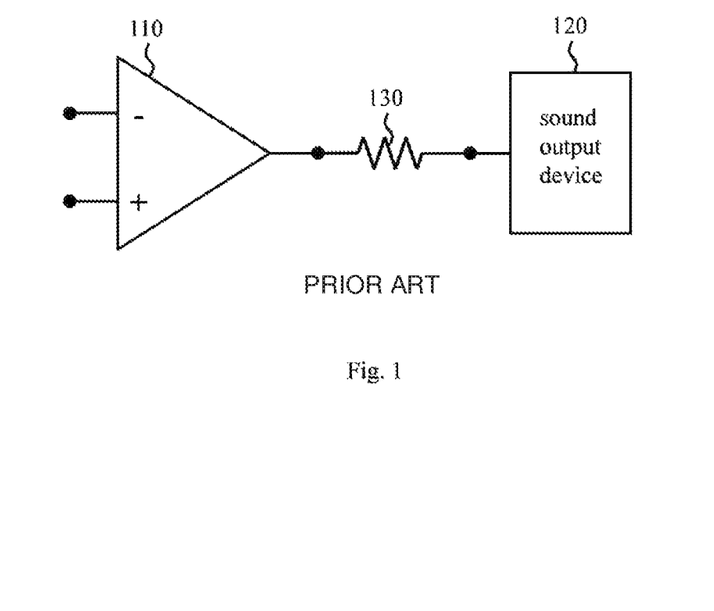
FIG. 1 illustrates the audio output mechanism of a prior art.

A consumer electronic device is usually equipped with one or more audio output jacks operable to be coupled with one or more sound output devices such as earphones or loud speakers. However, sound output devices in compliance with different specifications provide different output effects in response to the same audio signal, which means that an audio signal may be appropriate for a loud speaker to generate sound at proper volume while an earphone might generate sound at full volume based on the same signal, or an audio signal may be appropriate for an earphone to generate pleasing acoustic effect while another earphone might generate unpleasant acoustic effect according to the same signal. The aforementioned problems exist because an audio codec generating audio signals anticipates an output impedance (i.e. the expected input impedance of some sound output device receiving the audio signals) different from the impedance in reality and thereby outputs the audio signals at overly high or low amplitudes. In order to deal with some sound output device with a higher input impedance (e.g. an active loud speaker, which means that the concerned audio codec will face a higher output impedance) to provide a signal at higher volume, and further tackle some sound output device with a lower input impedance (e.g. an passive loud speaker or an earphone, which means that the concerned audio codec will face a lower output impedance) to provide a signal at lower volume, some known art sets a resistor 130 between an output buffer 110 of an audio codec and an external sound output device 120 in series (as it is shown in FIG. 1), so as to modify the energy of signals from the output buffer 110 to the sound output device 120 by the voltage-consuming property of the resistor 130. However, this solution has at least the following problems. First, if the sound output device 120 suffers from a capacitance or inductance effect, even though the output buffer 110 keeps the amplitude of its output signal stable regardless of the signal frequency, since the capacitance or inductance effect will vary by frequency and contribute to impedance variation, the sound output device 120 will still generate sound at unstable volume due to frequency variation. Moreover, since sound output devices of different specifications are likely to carry different capacitance or inductance effects, therefore it is hard for a designer to make adaptive modifications comprehensively. Second, the path from an audio codec to an audio output jack on a circuit board is normally long and vulnerable to noise interference; if the resistor 130 is introduced into the design, the output buffer 110 is able to reduce the noise coupling effect through a very low output impedance, but if the resistor 130 is installed, the output buffer 110 might lose its noise-reduction ability consequently. Third, the resistor 130 is usually a passive component of constant resistance on a circuit board; in consideration of so many kinds of sound output devices 120, a designer can hardly match the resistor 130 of constant resistance with all kinds of sound output devices 120, and thus a few cases would be taken care while others would be sacrificed.

People who are interested in the current arts can refer to the U.S. patent application by the following publication number: 20130158921.

SUMMARY OF THE INVENTION

In view of the problems of the prior art, an object of the present invention is to provide an impedance detecting device and method capable of solving the problems.

The present invention discloses an impedance detecting device capable of detecting the impedance of a load, so as to allow a device adopting the present invention to cope with the load appropriately. According to an embodiment of the present invention, the impedance detecting device comprises: an alternating current (AC) signal generating circuit operable to generate an AC signal; an output buffer operable to generate an output voltage and an output current according to the AC signal and the impedance value of a load; a current mirror operable to generate a mirror current according to the output current; a detection impedance operable to generate a detection voltage according to the mirror current; a comparing circuit operable to generate a comparison result by comparing the output voltage with the detection voltage; and a control circuit, coupled to the comparing circuit and at least one of the current mirror and the detection impedance, operable to adjust at least one of a current ratio of the mirror current to the output current and the impedance value of the detection impedance according to the comparison result until the comparison result has satisfied a predetermined requirement. In this embodiment, the frequency of the AC signal is less than a first frequency or more than a second frequency while the phase of the AC signal is different from the phase of the clock by a predetermined phase difference.

The present invention also discloses an impedance detecting method capable of detecting the impedance of a load, so that a device adopting the present invention can respond to the load appropriately. According to an embodiment of the present invention, the impedance detecting method comprises the following steps: providing an AC signal; generating an output voltage and an output current according to the AC signal and the impedance value of a load; generating a mirror current according to the output current; generating a detection voltage according to the impedance value of a detection impedance and the mirror current; generating a comparison result by comparing the output voltage with the detection voltage; and adjusting at least one of a current ratio of the mirror current to the output current and the impedance value of the detection impedance according to the comparison result until the comparison result has satisfied a predetermined requirement. In this embodiment, the frequency of the AC signal is less than a first frequency or more than a second frequency while the phase of the AC signal is different from the phase of the clock by a predetermined phase difference.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the disclosed embodiments can be direct or indirect provided that these embodiments are still practicable under such connection. Said "indirect" means that an intermediate object or a physical space is existed between the objects, or an intermediate event or a time interval is existed between the events.

The present invention discloses an impedance detecting device and method capable of detecting the impedance of a load, so that a device adopting the present invention can react to the load appropriately. The circuit and method are applicable to an integrated circuit (e.g. an audio codec) or a system device (e.g. an audio signal output device such as a computer, a mobile phone, a music player and etc.). Provided that an alternative means is available and reasonable, people of ordinary skill in the art can use such means similar or equivalent to those described in this specification to carry out the present invention, which implies that the scope of this invention is not limited to the embodiments in this specification. On account of that some element of the impedance detecting circuit of the present invention could be known, the detail of such element will be omitted provided that this omission nowhere dissatisfies the specification and enablement requirements. Besides, the impedance detecting method can be in the form of firmware and/or software which could be carried out by the impedance detecting circuit of this invention or the equivalent thereof; therefore, provided that the remaining disclosure is still enough for understanding and enablement, the following description will abridge the hardware details for carrying out the method, but put the emphasis on the steps.

Figure 2:
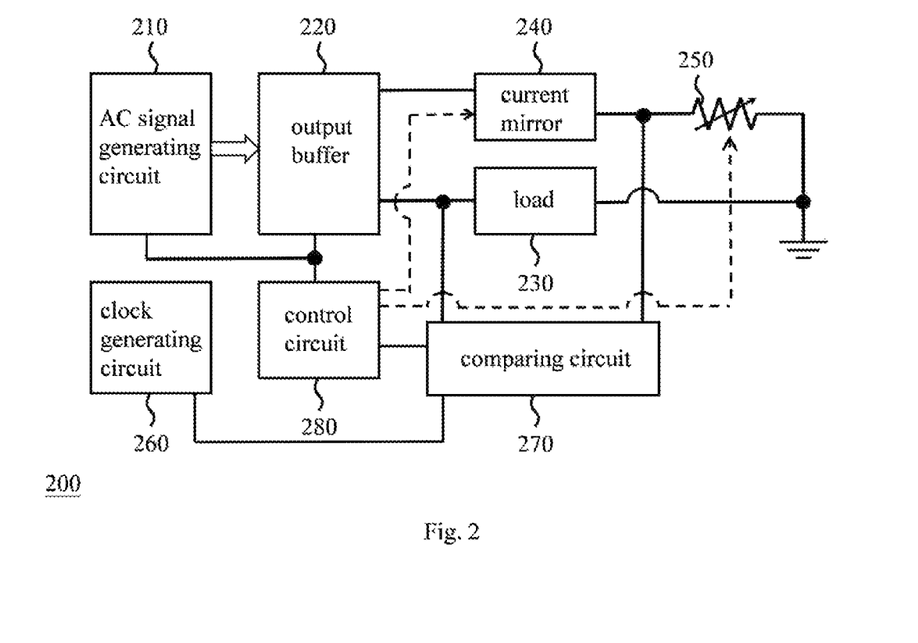
FIG. 2 illustrates an embodiment of the impedance detecting device of the present invention.

Please refer to FIG. 2 which illustrates an embodiment of the impedance detecting device of the present invention. This embodiment is capable of detecting the impedance of a load for modification of an output gain or other utilization. As it is shown in FIG. 2, the impedance detecting device 200 comprises: an alternating current (AC) signal generating circuit 210; an output buffer 220; a current mirror 240; a detection impedance 250; a clock generating circuit 260; a comparing circuit 270; and a control circuit 280. Said AC signal generating circuit 210 is operable to provide an AC signal such as a sine wave; however, other types of AC signal (e.g. a sine/cosine signal, triangular signal, rectangular signal or etc.) are also applicable to the present invention as long as such substitution is practicable. Said output buffer 220 is coupled with the AC signal generating circuit 210, operable to electrically connect with a load 230 and generate an output voltage and an output current in accordance with the AC signal and the impedance value of the load 230. Said current mirror 240 is coupled with the output buffer 220, operable to generate a mirror current according to the output current in which the mirror current is K times the output current while K is a positive number (e.g. a fractional number or an integer). In this embodiment, K is adjustable and may be adjusted for several times as the detection procedure goes on; the variation range of K could be determined by the demand of someone carrying out the present invention and the component and circuit design she/he adopted; however, if there is no need to do adjustment in K, it could be a constant value. Said detection impedance 250 is coupled with the current mirror 240, operable to generate a detection voltage according to the mirror current. In this embodiment, the impedance value of the detection impedance is adjustable. Said clock generating circuit 260 is operable to provide a clock which could be an operating clock or a sampling clock in light of the type of the comparing circuit 270. In this embodiment, the clock generating circuit 260 could be integrated into the AC signal generating circuit 210 or independent of it, or integrated into the comparing circuit 270 or independent of it; in an alternative embodiment, the clock generating circuit could be independent of the whole impedance detecting device 200. Said comparing circuit 270 is coupled with the output buffer 220 and the detection impedance 250, operable to compare the output voltage with the detection voltage according to the clock and thereby generate a comparison result. The comparing circuit 270 may include a single bit comparator (e.g. an operational amplifier) or a multi-bit comparator (e.g. an analog-to-digital converter (ADC)) in consideration of design requirement; if the comparing circuit 270 functions as the single bit comparator, the above-mentioned clock is an operating clock whose frequency is the same as or M times or 1/N times the frequency of the AC signal in which M, N are integers; and if the comparing circuit 270 functions as the multi-bit comparator, the clock here is a sampling clock. Said control circuit 280 is coupled with the comparing circuit 270 and at least one of the current mirror 240 and the detection impedance 250, operable to adjust at least one of a current ratio of the mirror current to the output current and the impedance value of the detection impedance according to the comparison result until the comparison result has reached a predetermined requirement. In this embodiment, the control circuit 280 could be realized through a combination of a micro controller, a comparator and a logic circuit, or a look-up table circuit, or any combination of the above-mentioned circuits; and the predetermined requirement could be the difference between the output voltage and detection voltage less than a threshold or the difference continuously going up and down in relation to a basis value.

Figure 3:
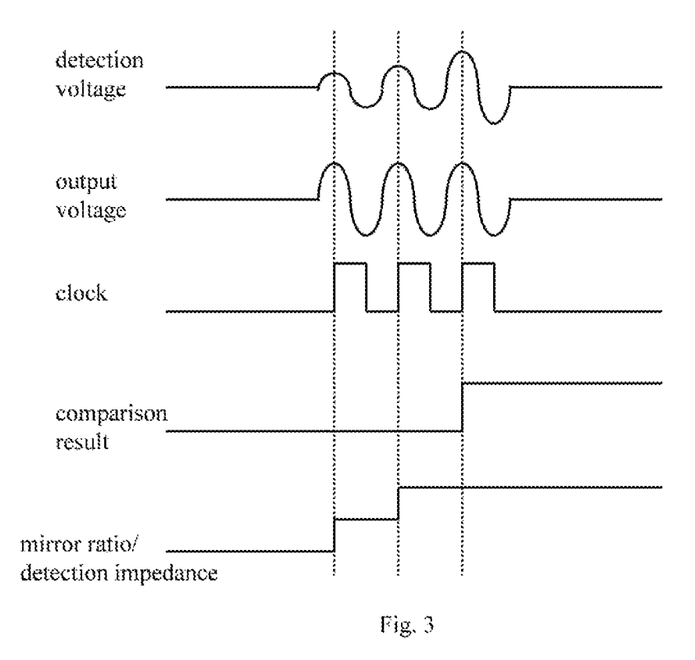
FIG. 3 illustrates the relationship of signals of FIG. 2.

Please refer to FIG. 2 again. In the present embodiment, the AC signal generating circuit 210 is a digital-to-analog converter (DAC), coupled with the control circuit 280 and operable to start or stop generating the AC signal under the control of the control circuit 280. Since the AC signal generating circuit 210 is implemented in DAC, it is able to precisely generate the AC signal in demand; of course other known signal generators could be used instead if such substitution is practicable. Besides, during impedance detection, the control circuit 280 makes the AC signal generating circuit 210 generate the AC signal to carry out continuous or intermittent detection; after the foresaid comparison result has satisfied the predetermined requirement, the control circuit 280 will make the AC signal generating circuit 210 stop generating the AC signal and allow the AC signal generating circuit 210 to resume a normal operation (e.g. an operation of generating an analog audio signal according to a source audio signal). Besides, as the aforementioned output voltage and detection voltage are generated in accordance with the AC signal, both of them will be voltages of periodic variation; under this circumstance, in order to make the comparing circuit 270 compare the peak values of the two voltages and generate the comparison result of relatively high accuracy according to the foresaid clock, a phase difference between the AC signal and the clock could be determined in advance, so that the comparing circuit 270 will be allowed to compare the peak values of the output voltage and detection voltage by the trigger of the rising and/or falling edge(s) of the clock. For instance; please refer to FIG. 3; if the frequencies of the AC signal and the clock are the same, the predetermined phase difference could be a quarter or three quarters of the cycle of the AC signal, so as to align the edge of the clock with the peak values of the output voltage and detection voltage; consequently, the comparing circuit 270 will compare the peak values of the two voltages and thereby generate a relatively reliable comparison result. Additionally, if the impedance detecting device 200 of the present invention is applied in an audio codec, in order to prevent a user from hearing some abnormal sound due to the AC signal, the present embodiment makes the frequency of the AC signal less than a first frequency or more than a second frequency in which the first and second frequencies could be the lower and upper frequency limits of human hearing. For example; the first frequency could be 20 Hz while the second frequency could be 20 KHz. Although different people will have different hearing abilities, the difference between the first and second frequencies in this embodiment is at least more than a predetermined value such as 10 KHz.

Figure 4:
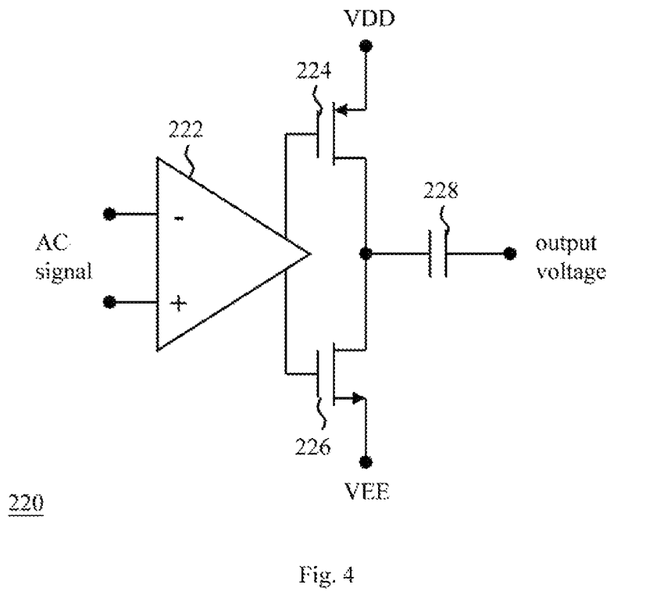
FIG. 4 illustrates an embodiment of the output buffer of FIG. 2.

Please refer to FIG. 4 which illustrates an embodiment of the output buffer 220 of FIG. 2. As it is shown in FIG. 4, the output buffer 220 includes: a buffer amplifier 222; a P-type transistor 224; an N-type transistor 226; and a coupling capacitor 228. The sources of the P-type and N-type transistors 224, 226 are coupled to a first bias VDD and a second bias VEE respectively, and the P-type and N-type transistors 224, 226 are operable to generate the output voltage during the positive and negative half-cycles of the AC signal respectively. The current mirror 240 of FIG. 2 could be coupled to any of the two transistors 224, 226 to thereby generate the mirror current. If the current mirror 240 is coupled with the P-type transistor 224 to generate the mirror current, the predetermined phase difference described in the preceding paragraph will be a quarter of the cycle of the AC signal; in the meantime, the comparing circuit 270 will compare the peak values (e.g. wave crests) of the output voltage and the detection voltage according to the rising edge (when the phase of the AC signal in comparison with the phase of the clock takes the lead) or the falling edge (when the phase of the AC signal falls behind the phase of the clock) of the clock. On the other hand, if the current mirror is coupled with the N-type transistor 226 to generate the mirror current, the predetermined phase difference will be three quarters of the cycle of the AC signal; meanwhile, the comparing circuit 270 will compare the peak values (e.g. wave troughs) of the output voltage and the detection voltage according to the rising edge (when the phase of the AC signal gets ahead of the phase of the clock) or the falling edge (when the phase of the AC signal falls behind the phase of the clock) of the clock. Please note that the comparing circuit 270 may carry out comparison in accordance with both the rising and falling edges of the clock through an appropriate design. Since the operation based on the trigger of a clock edge is well known in this technical field, the detail of such operation is therefore omitted. Please also note that some design of output buffer does not include a coupling capacitor such as the coupling capacitor 228 in FIG. 4; however, since the present invention makes use of an AC signal for impedance detection, it can be done regardless of the presence or absence of the coupling capacitor. Please further note that although the embodiments of FIG. 2 and FIG. 4 take the output buffer with two input ends and a single output end for example, those of ordinary skill in the art can feel free to use other types of output buffer on the basis of the disclosure of this invention as long as the whole device is still practicable.

Please refer to FIG. 2 once more. If the comparing circuit 270 includes a multi-bit comparator (e.g. an ADC), the comparing circuit 270 may generate an output-voltage multi-bit signal and a detection-voltage multi-bit signal according to the output voltage and the detection voltage respectively, and then generate the comparison result by comparing the two multi-bit signals. Besides, please refer to FIG. 2 and FIG. 3. The control circuit 280 may adjust the current ratio (i.e. mirror ratio) of the mirror current to the output current and/or the impedance value of the detection impedance 250 according to the comparison result and a prescribed rule until the comparison result has satisfied the foresaid predetermined requirement. More specifically, if all the control circuit 280 needs to do is adjust the current ratio, the detection impedance 250 could be a constant impedance instead of an adjustable impedance; if all the control circuit 280 needs to do is adjust the impedance value, the current ratio could be a constant ratio (which means that the current mirror 240 is not adjustable); and if the control circuit 280 needs to adjust both of the current ratio and the detection impedance, the current mirror 240 and the detection impedance 250 should be adjustable as the preceding paragraphs said. Please note that said prescribed rule could be a rule determined by the precision of adjustment of the current mirror 240 and/or detection impedance 250, a rule defining an order of adjustment; a rule indicating the preference for the current ratio adjustment or detection impedance adjustment, or a rule specified by a person of ordinary skill in the art.

In light of the above, after the comparison result has reached the predetermined requirement, the control circuit 280 can find out the impedance value of the aforementioned load 230 in accordance with the already known output voltage (which is derived from the controlled AC signal), the current ratio of the mirror current to the output current and the impedance value of the detection impedance 250, and then modify the gain setting of at least one of the AC signal generating circuit 210 and the output buffer 220 according to the impedance value of the load 230, so that the energy of an output signal (e.g. an audio output signal) could be altered adaptively in accordance with the impedance value of the load 230. For instance; if the impedance detecting device 200 of the present invention is included in an audio codec and the load 230 reflects the impedance of an external sound output device in connection with the audio codec, through the present invention, no matter what kind of the external sound output device is, the control circuit 280 is able to estimate the impedance value of the load 230 according to the impedance detection result, and thereby adjust the gain setting value(s) of the AC signal generating circuit 210 and/or output buffer 220 appropriately, so that the audio codec can output a well-modified audio signal to the sound output device to reach high fidelity.

Figure 5:
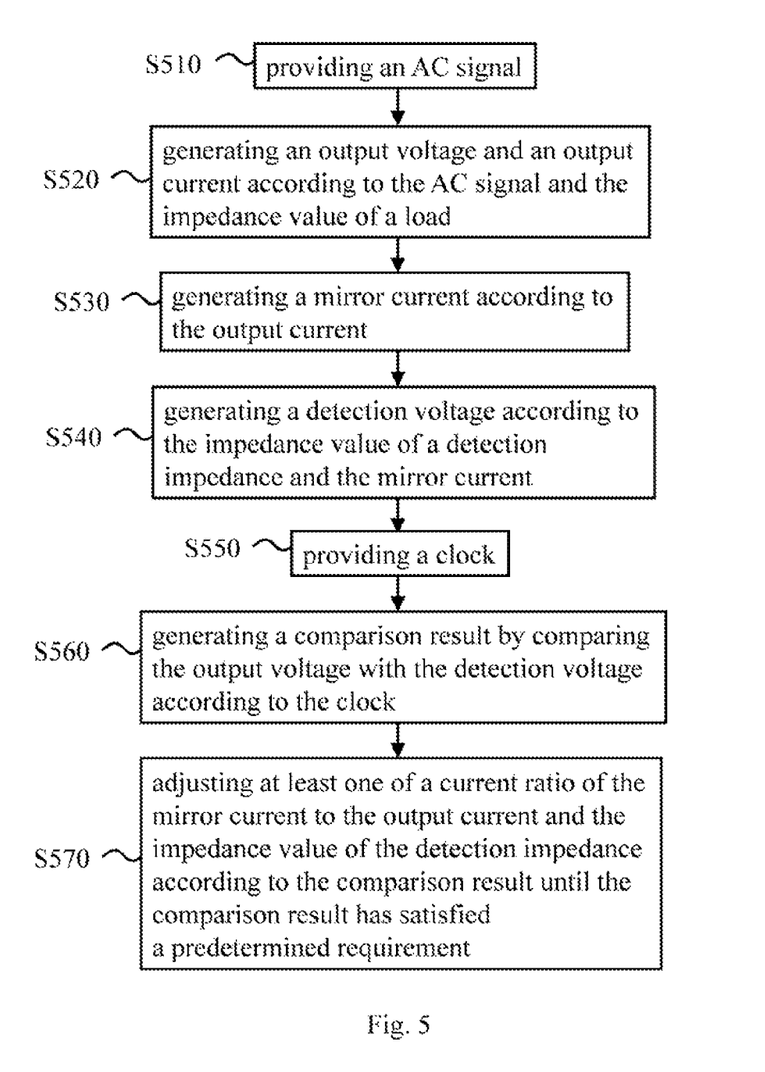
FIG. 5 illustrates an embodiment of the impedance detecting method of the present invention.

In addition to the above-disclosed device, the present invention also discloses an impedance detecting method capable of detecting the impedance of a load for gain modification or other utilization. As it is shown in FIG. 5, an embodiment of the method comprises the following steps:

Step S510: providing an AC signal. This step could be carried out by the AC signal generating circuit 210 of FIG. 2 or its equivalent.

Step S520: generating an output voltage and an output current according to the AC signal and the impedance value of a load. This step could be carried out by the output buffer 220 of FIG. 2 or its equivalent.

Step S530: generating a mirror current according to the output current. This step could be carried out by the current mirror 240 or its equivalent.

Step S540: generating a detection voltage according to the impedance value of a detection impedance and the mirror current. This step could be carried out by the detection impedance 250 of FIG. 2 or its equivalent.

Step S550: providing a clock which could be an operating clock or a sampling clock in light of the following step S560. This step could be carried out by the clock generator 260 of FIG. 2 or its equivalent, and could be separated from the whole method in an alternative embodiment.

Step S560: generating a comparison result by comparing the output voltage with the detection voltage according to the clock. This step could be carried out by the comparing circuit 270 of FIG. 2 or its equivalent.

Step S570: adjusting at least one of a current ratio of the mirror current to the output current and the impedance value of the detection impedance according to the comparison result until the comparison result has satisfied a predetermined requirement. This step could be carried out by the control circuit 280 of FIG. 2 or its equivalent.

Figure 6:
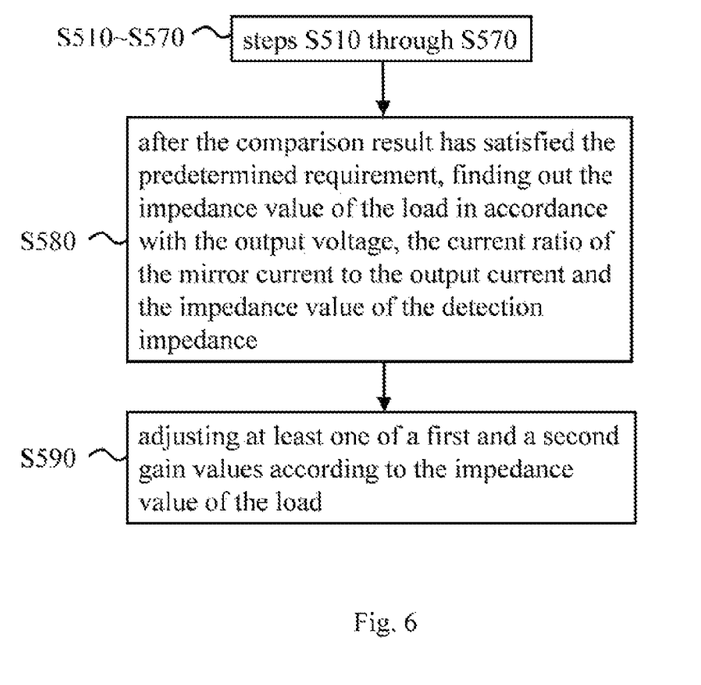
FIG. 6 illustrates another embodiment of the impedance detecting method of the present invention.

On the basis of the above, in this embodiment the phase of the AC signal is made to be different from the phase of the clock by a predetermined phase difference, so that step S560 is able to compare the peak values of the output voltage and the detection voltage and thereby generate a relatively reliable comparison result. For instance, if the frequencies of the AC signal and the clock are the same, the predetermined phase difference could be one-fourth or three-fourths of the cycle of the AC signal. Besides, in order to prevent the AC signal from causing some abnormal sound available to humans, step S510 might make the frequency of the AC signal stay below a first frequency (e.g. 20 Hz) or above a second frequency (e.g. 20 KHz) in which the difference between the first and second frequencies is more than 10 KHz. Furthermore, if step S560 is realized by a multi-bit comparator, step S560 may further include: generating an output-voltage multi-bit signal according to the output voltage; generating a detection-voltage multi-bit signal according to the detection voltage; and comparing the output-voltage multi-bit signal with the detection-voltage multi-bit signal to thereby generate the comparison result. Moreover, as it is shown in FIG. 6, after finishing steps S510 through S570, the present embodiment may further comprises the following steps:

Step S580: after the comparison result has satisfied the predetermined requirement, finding out the impedance value of the load in accordance with the output voltage, the current ratio of the mirror current to the output current and the impedance value of the detection impedance; and Step S590: adjusting at least one of a first and a second gain values according to the impedance value of the load in which examples of the first and second gain values are the gain setting values of the aforementioned AC signal generating circuit 210 and the output buffer 220 respectively.

Finally, if the present embodiment is adopted in an audio codec or something similar, step S510 and step S520 may include: before the comparison result satisfies the predetermined requirement, providing the AC signal and generating the output voltage; and after the comparison result has satisfied the predetermined requirement, generating an audio signal according to an audio data and a first gain value and then generating an audio signal voltage according to the audio signal and a second gain value. More specifically, the step of generating the audio signal could be carried out by the AC signal generating circuit 210 of FIG. 2 while the first gain value is the gain setting value of the AC signal generating circuit 210; and the step of generating the audio signal voltage could be carried out by the output buffer 220 of FIG. 2 while the second gain value is the gain setting value of the output buffer 220.

Since those of ordinary skill in the art can appreciate the implementation detail and modification thereto of this method invention by referring to the fore-described device invention of FIG. 2 through FIG. 5, repeated and redundant description is therefore omitted provided that the remaining disclosure is still enough for understanding and enablement. Please note that the shape, size, and ratio of any element and the step sequence of any flow chart in the figures are just exemplary for understanding, not for limiting the scope of this invention. Furthermore, each embodiment in the following description includes one or more features; however, this doesn't mean that one carrying out the present invention should make use of all the features of one embodiment at the same time, or should only carry out different embodiments separately. In other words, if an implementation derived from one or more of the embodiments is practicable, a person of ordinary skill in the art can selectively make use of some or all of the features in one embodiment or selectively make use of the combination of some or all features in several embodiments to have the implementation come true, so as to increase the flexibility of carrying out the present invention.

In summary, the impedance detecting device and method of the present invention include at least the following advantages. First, an adaptive adjustment is realized through detecting the actual impedance of a load, so as to avoid the problems of the prior art; second, the impedance detection is carried out with an AC signal instead of a DC signal and thus applicable to a circuit with a coupling capacitor (which will block DC signals); third, any abnormal sound available to human hearing will not be generated because of the confinement to the frequency and/or waveform of the AC signal; and fourth, the impedance detection can be accelerated and/or the detection range can be enlarged by the modification of the concerned current and impedance.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An impedance detecting device capable of detecting the impedance value of a load, comprising:
   an alternating current (AC) signal generating circuit operable to generate an AC signal;
   an output buffer operable to generate an output voltage and an output current according to the AC signal and the impedance value of the load;
   a current mirror operable to generate a mirror current according to the output current;
   a detection impedance operable to generate a detection voltage according to the mirror current;
   a comparing circuit operable to generate a comparison result by comparing the output voltage with the detection voltage; and
   a control circuit, coupled to the comparing circuit and at least one of the current mirror and the detection impedance, operable to adjust at least one of a current ratio of the mirror current to the output current and the impedance value of the detection impedance according to the comparison result until the comparison result has satisfied a predetermined requirement.

2. The impedance detecting device of claim 1, wherein the AC signal generating circuit includes a digital-to-analog converter (DAC) operable to start or stop generating the AC signal under the control of the control circuit.

3. The impedance detecting device of claim 1, further comprising: a clock generating circuit operable to provide a clock while the comparing circuit is operable to generate a comparison result by comparing the output voltage with the detection voltage according to the clock.

4. The impedance detecting device of claim 3, wherein the phase of the AC signal is different from the phase of the clock by a predetermined phase difference.

5. The impedance detecting device of claim 4, wherein the predetermined phase difference is a quarter or three quarters of the cycle of the AC signal.

6. The impedance detecting device of claim 5, wherein the output buffer includes a P-type transistor and an N-type transistor which are operable to generate the output voltage during the positive and negative half-cycles of the AC signal respectively, and when the current mirror is coupled to the P-type transistor for generating the mirror current, the predetermined phase difference is a quarter of the cycle of the AC signal, and when the current mirror is coupled to the N-type transistor for generating the mirror current, the predetermined phase difference is three quarters of the cycle of the AC signal.

7. The impedance detecting device of claim 1, wherein the frequency of the AC signal is less than a first frequency or more than a second frequency, and the difference between the first and second frequencies is more than a predetermined value.

8. The impedance detecting device of claim 7, wherein the first frequency is 20 Hz while the second frequency is 20 KHz.

9. The impedance detecting device of claim 1, wherein the AC signal is a sine wave.

10. The impedance detecting device of claim 1, wherein the comparing circuit is operable to generate an output-voltage multi-bit signal and a detection-voltage multi-bit signal according to the output voltage and the detection voltage respectively, and then generate the comparison result by comparing the output-voltage multi-bit signal with the detection-voltage multi-bit signal.

11. The impedance detecting device of claim 1, wherein the control circuit is operable to adjust the at least one of the current ratio of the mirror current to the output current and the impedance value of the detection impedance according to the comparison result and a prescribed rule until the comparison result has satisfied the predetermined requirement.

12. The impedance detecting device of claim 1, wherein after the comparison has satisfied the predetermined requirement, the control circuit is operable to find out the impedance value of the load in accordance with the output voltage, the current ratio of the mirror current to the output current and the impedance value of the detection impedance, and then adjust a gain setting value of at least one of the AC signal generating circuit and the output buffer according to the impedance value of the load.

13. The impedance detecting device of claim 1, which is applied in an audio codec, wherein the AC signal generating circuit is operable to output the AC signal before the comparison result satisfies the predetermined requirement, and output an analog audio signal in response to a source audio signal after the comparison result has satisfied the predetermined requirement.

14. An impedance detecting method capable of detecting the impedance value of a load, comprising the following steps:

providing an alternating current (AC) signal;
generating an output voltage and an output current according to the AC signal and the impedance value of the load;
generating a mirror current according to the output current;
generating a detection voltage according to the impedance value of a detection impedance and the mirror current;
generating a comparison result by comparing the output voltage with the detection voltage; and
adjusting at least one of a current ratio of the mirror current to the output current and the impedance value of the detection impedance according to the comparison result until the comparison result has satisfied a predetermined requirement.

15. The impedance detecting method of claim 14, further comprising a step of providing a clock while the step of generating the comparison result is executed by referring to the clock.

16. The impedance detecting method of claim 15, wherein the phase of the AC signal is different from the phase of the clock by a predetermined phase difference.

17. The impedance detecting method of claim 16, wherein the AC signal is a sine wave, and the predetermined phase difference is a quarter or three quarters of the cycle of the AC signal.

18. The impedance detecting method of claim 14, wherein the frequency of the AC signal is less than a first frequency or more than a second frequency, and the difference between the first and second frequencies is more than a predetermined value.

19. The impedance detecting method of claim 14, wherein the frequency of the AC signal is less than a first frequency or more than a second frequency, and thereby outside the frequency range of human hearing.

20. The impedance detecting method of claim 14, wherein the step of generating the comparison result includes:
generating an output-voltage multi-bit signal according to the output voltage;
generating a detection-voltage multi-bit signal according to the detection voltage; and
comparing the output-voltage multi-bit signal with the detection-voltage multi-bit voltage to thereby generate the comparison result.

21. The impedance detecting method of claim 14, wherein the steps of providing the AC signal and generating the output voltage include:
before the comparison result satisfies the predetermined requirement, providing the AC signal and generating the output voltage; and
after the comparison result has satisfied the predetermined requirement, generating an audio signal according to an audio data and a first gain value and then generating an audio signal voltage according to the audio signal and a second gain value.

22. The impedance detecting method of claim 14, further comprising:
after the comparison result has satisfied the predetermined requirement, finding out the impedance value of the load in accordance with the output voltage, the current ratio of the mirror current to the output current and the impedance value of the detection impedance.

* * * * *